US012775062B2

(12) United States Patent
Shi et al.

(10) Patent No.: US 12,775,062 B2
(45) Date of Patent: Oct. 27, 2026

(54) INNOVATIVE OPEN WAVEGUIDE BEND FOR LEAKAGE MITIGATION

(71) Applicant: Aptiv Technologies AG, Schaffhausen (CN)

(72) Inventors: Shawn Shi, Newbury Park, CA (US); Qinjiang Rao, Oak Park, CA (US)

(73) Assignee: Aptiv Technologies AG, Schaffhausen (CH)

( * ) Notice: Subject to any disclaimer, the term of this patent is extended or adjusted under 35 U.S.C. 154(b) by 277 days.

(21) Appl. No.: 18/640,614

(22) Filed: Apr. 19, 2024

(65) Prior Publication Data

US 2026/0036670 A1 Feb. 5, 2026

(51) Int. Cl.

*G01S 7/03* (2006.01)
*H01P 1/02* (2006.01)
*H01P 5/02* (2006.01)
*H05K 1/02* (2006.01)

(52) U.S. Cl.

CPC ................ *G01S 7/03* (2013.01); *H01P 1/022* (2013.01); *H01P 5/022* (2013.01); *H05K 1/0243* (2013.01); *H05K 2201/10098* (2013.01)

(58) Field of Classification Search

CPC . G01S 7/03; H01P 1/022; H01P 5/022; H01P 5/107; H01P 3/121; H01P 3/12; H01P 1/02; H05K 1/0243; H05K 2201/10098; H01Q 1/2283

USPC .......................................................... 342/175

See application file for complete search history.

(56) References Cited

U.S. PATENT DOCUMENTS 3,015,100 A * 12/1961 Rotman ................. H01Q 13/20 343/772
3,523,297 A * 8/1970 Fee .......................... H01Q 5/42 343/729
3,653,054 A * 3/1972 Wen ....................... H01Q 3/443 343/778
5,162,806 A * 11/1992 Monser ................ H01Q 19/065 343/753

(Continued)

FOREIGN PATENT DOCUMENTS

EP 4568012 A1 * 6/2025 ........... H04B 1/3822
WO WO-2023043765 A1 * 3/2023 ............. H01Q 13/22

OTHER PUBLICATIONS

Extended European Search Report regarding European Patent Application No. 24213915.2, dated Apr. 28, 2025.

*Primary Examiner* — Nuzhat Pervin

(74) *Attorney, Agent, or Firm* — Harness, Dickey & Pierce, P.L.C.

(57) ABSTRACT

A radar control module includes a printed circuit board including a radio frequency port. A trough waveguide antenna is mounted to the printed circuit board and includes a base and a first sidewall and a second sidewall each extending from the base. A fin extends from the base along a center region between the first sidewall and the second sidewall and an open side opposite the base. A first channel is disposed between the first sidewall and the fin and a second channel is formed between the second sidewall and the fin. The trough waveguide antenna includes a bend region in which the first channel is on an interior of the bend region and the second channel is on an exterior of the bend region and a depth of the first channel is deeper in the bend region than a depth of the second channel in the bend region.

14 Claims, 4 Drawing Sheets

(56) References Cited

U.S. PATENT DOCUMENTS

| | | | | | |
|---|---|---|---|---|---|
| 5,459,471 | A * | 10/1995 | Thomas | H01Q 13/06 | 342/175 |
| 5,943,023 | A * | 8/1999 | Sanford | H01Q 13/0233 | 343/786 |
| 6,043,787 | A * | 3/2000 | Sanford | H01Q 13/02 | 343/786 |
| 9,300,025 | B2 * | 3/2016 | Herbsommer | G02B 6/4416 | |
| 9,515,366 | B2 * | 12/2016 | Herbsommer | G02B 6/4416 | |
| 9,515,367 | B2 * | 12/2016 | Herbsommer | G02B 6/4416 | |
| 10,461,390 | B2 * | 10/2019 | Zhou | H01P 1/184 | |
| 11,646,479 | B2 * | 5/2023 | Lang | G01S 7/032 | 342/200 |
| 12,183,963 | B2 * | 12/2024 | Hollenbeck | H01Q 21/0037 | |
| 2002/0075185 | A1 * | 6/2002 | Wang | H01Q 1/243 | 343/702 |
| 2013/0314283 | A1 * | 11/2013 | Hong | H01P 11/008 | 343/700 MS |
| 2014/0285277 | A1 * | 9/2014 | Herbsommer | G02B 6/4416 | 333/1 |
| 2014/0285292 | A1 * | 9/2014 | Herbsommer | G02B 6/4416 | 333/254 |
| 2014/0287701 | A1 * | 9/2014 | Herbsommer | G02B 6/4416 | 343/818 |
| 2016/0064825 | A1 * | 3/2016 | Ng | H01Q 1/364 | 343/785 |
| 2017/0093049 | A1 * | 3/2017 | Lahti | H01Q 13/02 | |
| 2019/0109372 | A1 * | 4/2019 | Chen | H01Q 21/0043 | |
| 2020/0059007 | A1 * | 2/2020 | Wang | H01Q 13/18 | |
| 2020/0136225 | A1 * | 4/2020 | Shi | G01S 13/931 | |
| 2021/0359407 | A1 * | 11/2021 | Xiao | H01Q 5/48 | |
| 2023/0085413 | A1 * | 3/2023 | Clavijo | H01Q 1/2283 | 343/785 |
| 2023/0352841 | A1 * | 11/2023 | Vasanelli | H01P 5/107 | |
| 2023/0378656 | A1 * | 11/2023 | Brandenburg | H01P 5/107 | |
| 2024/0204413 | A1 * | 6/2024 | Lee | H01Q 13/10 | |
| 2024/0250443 | A1 * | 7/2024 | Shi | H01Q 1/3233 | |
| 2025/0070482 | A1 * | 2/2025 | Clavijo | H01P 3/123 | |

* cited by examiner

PRIOR
ART

INNOVATIVE OPEN WAVEGUIDE BEND FOR LEAKAGE MITIGATION

FIELD

The present disclosure relates to an innovative open waveguide bend for leakage mitigation.

BACKGROUND

This section provides background information related to the present disclosure which is not necessarily prior art.

A side opened rectangular waveguide antenna called asymmetrical trough waveguide antennas have been proposed for use since the 1950s. The asymmetrical trough waveguide antenna provides for economical fabrication with a single layered structure and mechanical simplicity. Some trough waveguide antennas have a bend for antenna routing. The bend in the trough waveguide antenna results in unacceptable leaks. Accordingly, it is desirable to provide an open waveguide bend with improved leakage mitigation.

SUMMARY

This section provides a general summary of the disclosure, and is not a comprehensive disclosure of its full scope or all of its features.

According to an aspect of the present disclosure, a radar control module includes a printed circuit board including a radio frequency port. A trough waveguide antenna is mounted to the printed circuit board and includes a base and a first sidewall and a second sidewall each extending from the base. A fin extends from the base along a center region between the first sidewall and the second sidewall and an open side opposite the base. A first channel is disposed between the first sidewall and the fin and a second channel is formed between the second sidewall and the fin. The trough waveguide antenna includes a bend region in which the first channel is on an interior of the bend region and the second channel is on an exterior of the bend region and a depth of the first channel is deeper in the bend region than a depth of the second channel in the bend region.

According to a further aspect, the printed circuit board includes a monolithic microwave integrated circuit (MMIC) for providing radio frequency signals to the radio frequency port.

According to a further aspect, a transition path extends from the radio frequency port to an end of the trough waveguide antenna.

According to a further aspect, the depth of the first channel includes a transition region which gradually increases in depth at an end entering into the bend region.

According to a further aspect, the depth of the first channel includes a transition region which gradually decreases in depth at an end exiting the bend region.

According to a further aspect, the bend region includes a radiused 90 degree bend.

According to a further aspect, the depth of the second channel has a constant depth along a length of the trough waveguide antenna.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 8:
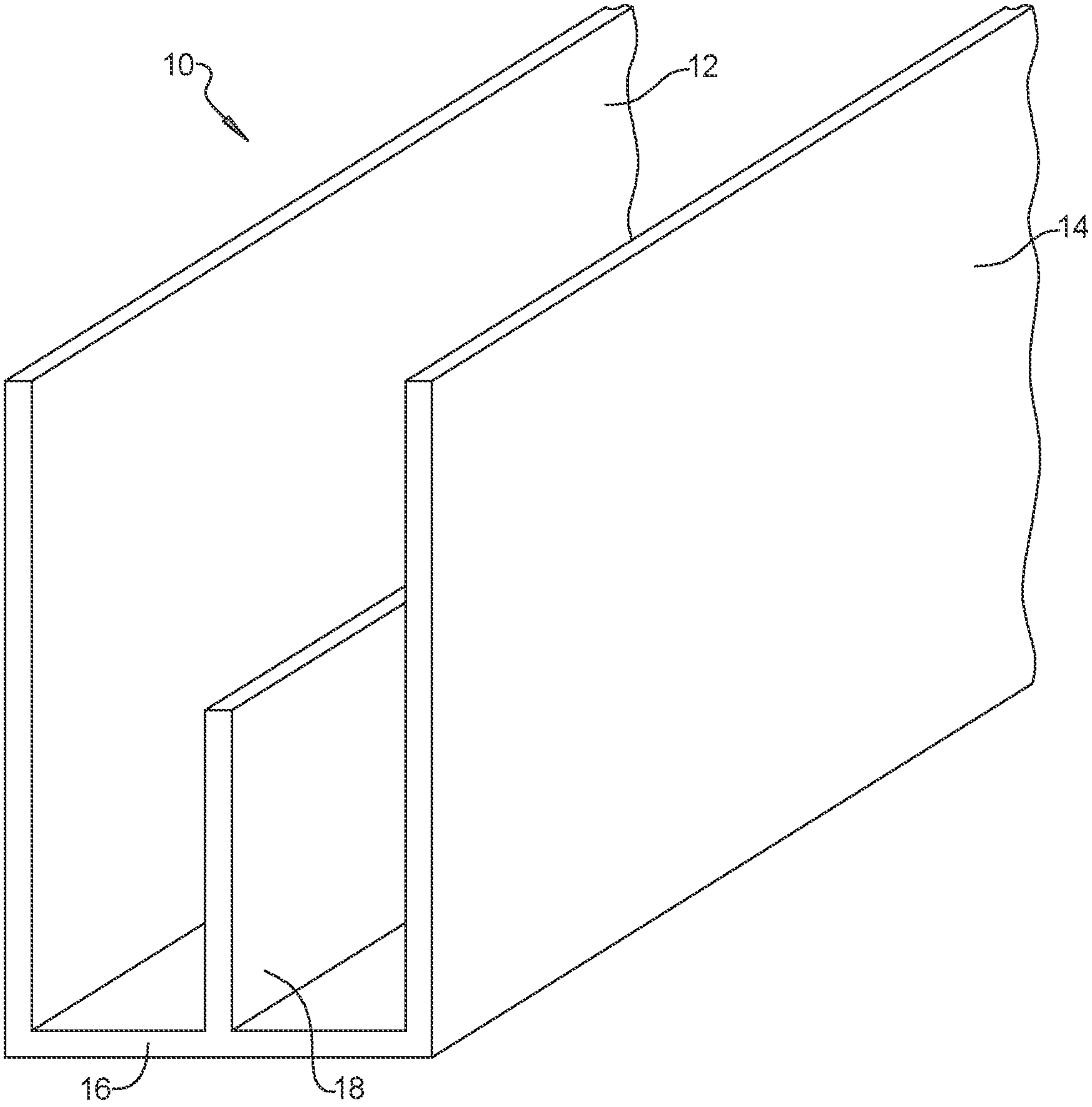
FIG. 8 is a perspective view of a known trough waveguide antenna according to the principles of the present disclosure.

With reference to FIG. 8, a known trough waveguide antenna 10 is shown as disclosed in U.S. Pat. No. 3,015,100. The trough waveguide antenna includes a pair of sidewalls 12, 14, a bottom wall 16 and a substantially centrally disposed fin member 18. When the side walls 12, 14 are less than one half wavelength apart, a transverse electric mode may be propagated along the axis of the guide. This mode is “bound” to the center fin and has an electric field with a general configuration as shown in FIG. 8. The intensity of the filed lines of the electric vector increases from the bottom 16 of the waveguide to the top of the central vane or fin 18. The transverse currents on the sides of fin 18 vary from a minimum at the free edge to a maximum at its base.

Figure 1:
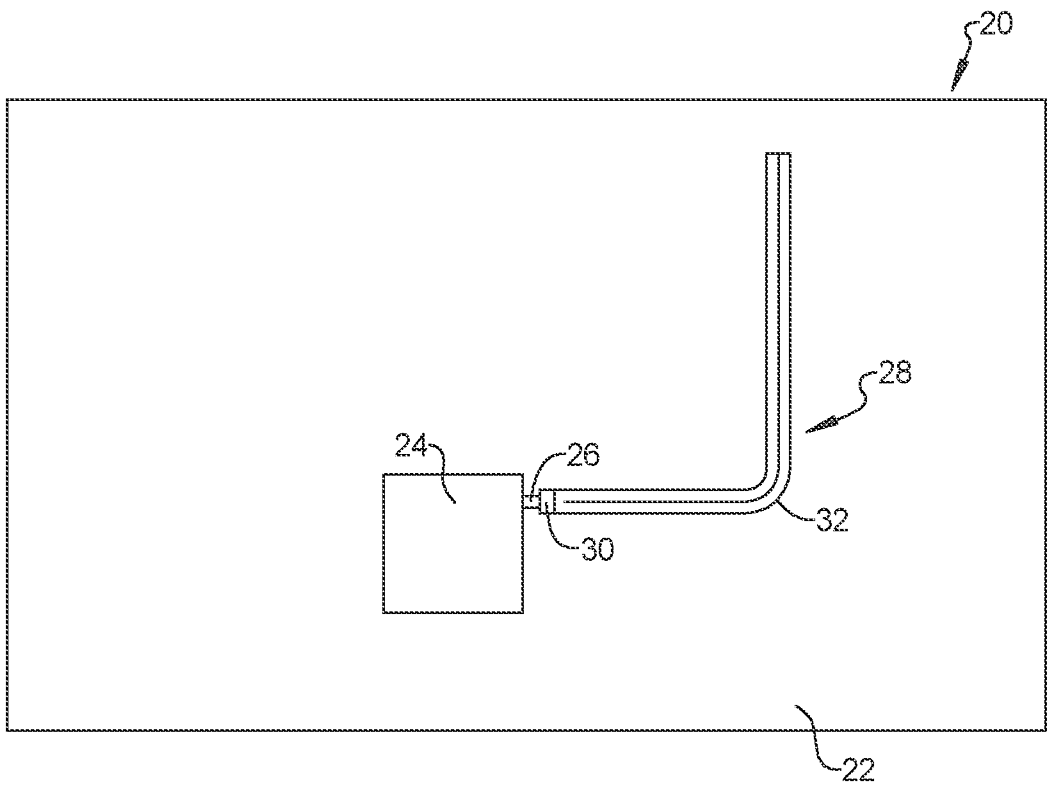
FIG. 1 is a schematic top view of a radar control module board according to the principles of the present disclosure.
Figure 2:
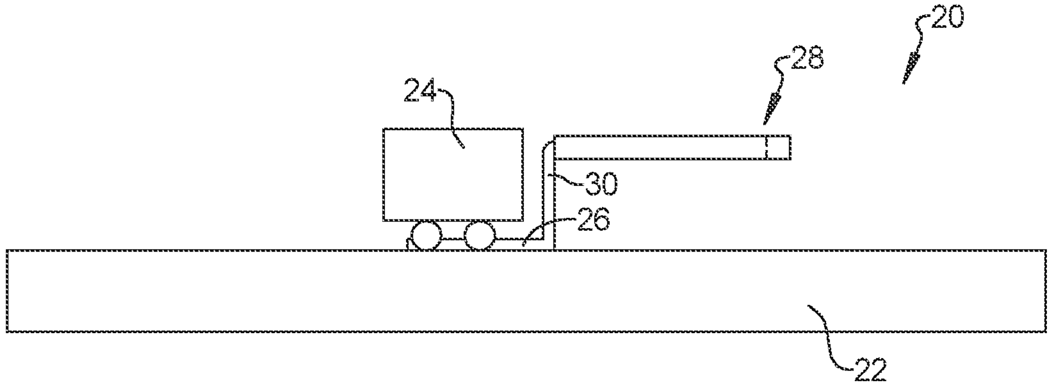
FIG. 2 is a schematic side view of the radar control module board according to the principles of the present disclosure.
Figure 3:
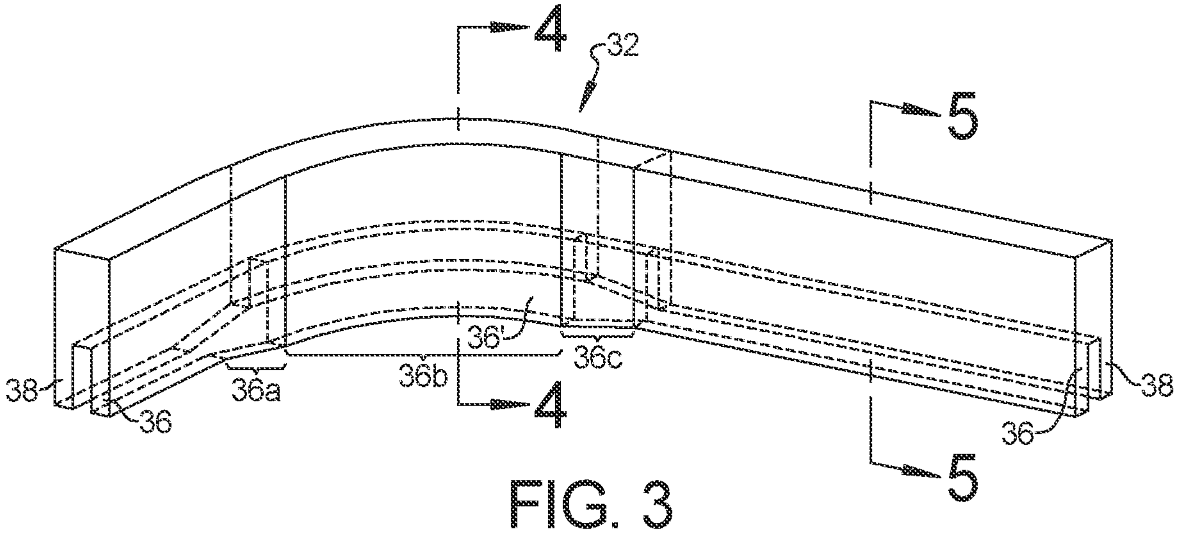
FIG. 3 is a perspective view of the space within the trough waveguide antenna according to the principles of the present disclosure.

With reference to FIGS. 1 and 2, a radar control module board 20 is shown including a printed circuit board 22. A monolithic microwave integrated circuit (MMIC) 24 is mounted to the printed circuit board 22. The MMIC 24 provides a radio frequency port 26. A trough waveguide antenna 28 is mounted to the printed circuit board 22. A transition structure 30 is mounted to an end of the trough waveguide antenna 28. The transition structure 30 defines a transition pathway for the radio frequency signal from the radio frequency port 26 of the MMIC 24. The trough waveguide antenna 28 includes a bend region 32 that can be provided for antenna routing on the printed circuit board 22.

The trough waveguide antenna 28 is similar to the trough waveguide antenna 10 disclosed in U.S. Pat. No. 3,015,100 and can be modified in known ways to include asymmetries 34 within the trough and other variations. In particular, the trough waveguide antenna 28 includes a pair of sidewalls 12, 14, a bottom wall 16 and a substantially centrally disposed fin member 18. The trough waveguide antenna 28 has an open side opposite the bottom wall and include open ends.

Figure 7:
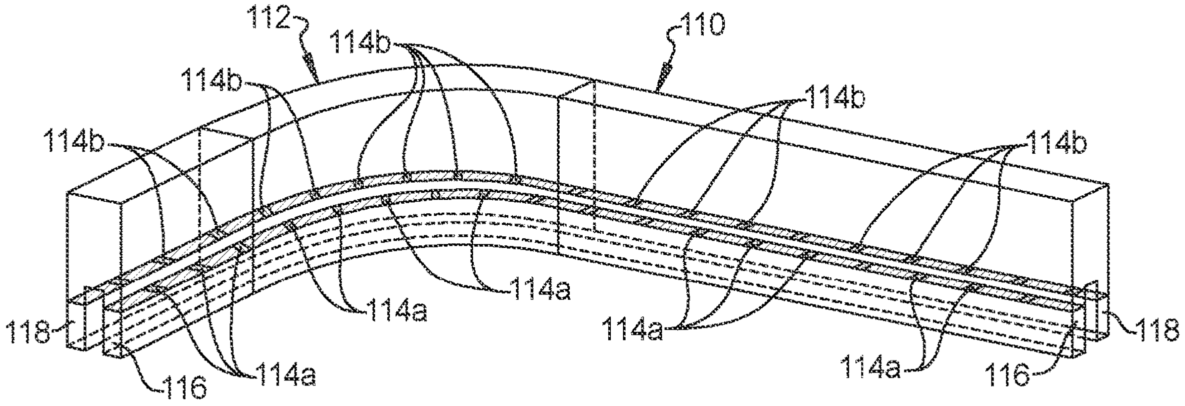
FIG. 7 is a perspective view of the space within a conventional trough waveguide antenna having a bend region and illustrating the phase of the radio frequency signal in both the inner and outer channels.

With reference to FIG. 7, a space 110 within a conventional trough waveguide antenna having a bend region 112 is shown. As illustrated by the markings 114*a*, 114*b*, the phase of the two channels 116, 118 on each side of the fin 18 are aligned prior to the bend region 112. However, as the radio frequency signal enters the bend region 112 of the trough waveguide antenna, the longer path of the outer channel 118 causes the phases within the two channels to be misaligned. The unmatched phase can result in losses and according to tests performed, a 5 dB signal loss per bend region has been observed.

Figure 4:
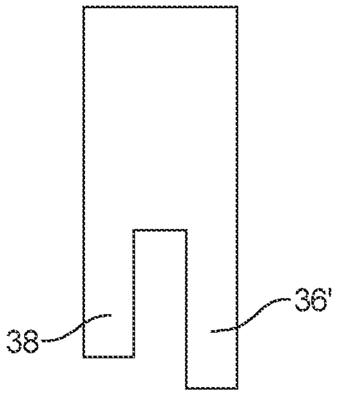
FIG. 4 is a cross-sectional view of the space within a bend region of the trough waveguide antenna according to the principles of the present disclosure.
Figure 5:
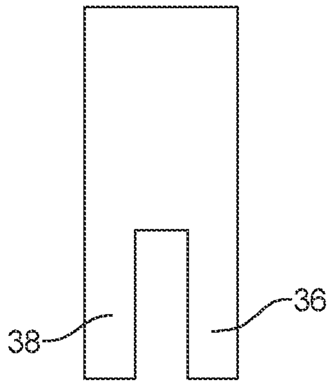
FIG. 5 is a cross-sectional view of the space within a straight region of the trough waveguide antenna according to the principles of the present disclosure.

With reference to FIGS. 3-6, according to the principles of the present disclosure, the trough waveguide antenna 28 includes an inner channel 36 that is on an interior side of the fin 18 in the bend region 32 and outer channel 38 that is on an outer side of the fin 18 in the bend region 32. The bend region 32 can include a radiused bend of between 30 and 120 degrees and, more preferably, 90 degrees. The inner channel 36' transitions to have a greater depth within the bend region 32, as best illustrated in FIG. 4. At the end of the bend region 32, the inner channel 36 transitions back to having a shallower depth that can be equal to a depth of the outer channel 38, as best illustrated by FIG. 5.

Figure 6:
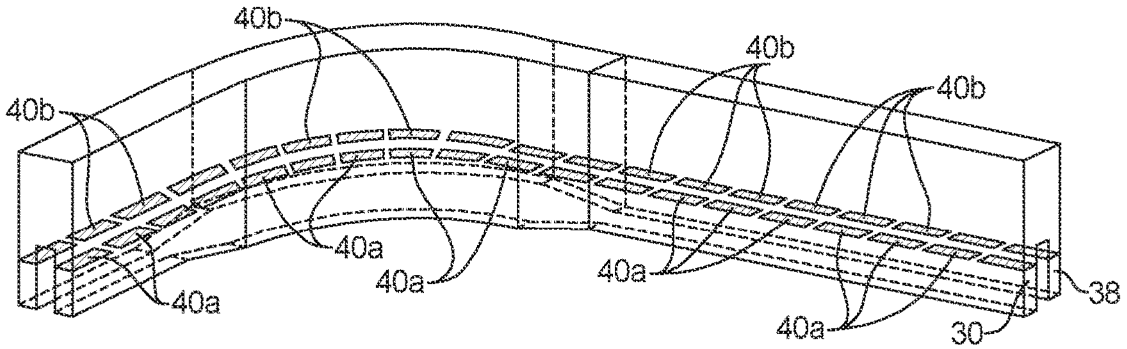
FIG. 6 is a perspective view of the space within the trough waveguide antenna having a bend region and illustrating the phase of the radio frequency signal in both the inner and outer channels according to the principles of the present disclosure.

With reference to FIG. 6, a three-dimensional illustration of the space within the trough waveguide antenna 28 having a bend region 32 according to the principles of the present disclosure is shown. As illustrated by the markings 40*a*, 40*b*, the phase of the two channels 36, 38 on each side of the fin 18 are aligned and remain aligned as the signal passes through the modified bend region having a deeper interior channel 36' within the bend region that accounts for the longer path of the outer channel 38.

The change in depth of the inner channel can be determined based upon the bend radius and radio frequency that is used in order to maintain the radio frequencies passing through the inner and outer channels in phase. In addition, the depth of the inner channel within the bend region 32 can gradually get deeper through a first transition region 36*a* and maintain a constant depth through a deepest region 36*b* and then gradually gets shallower through a second transition region 36*c* until the inner channel has a same depth as the outer channel at the end of the bend region 32. Through testing, it has been confirmed that the modified inner channel depth 36' results in reduced losses and according to tests performed, a 0.8 dB signal loss per bend region has been observed without adding an additional cost to the trough waveguide antenna.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A radar control module, comprising:

a printed circuit board including a radio frequency port;

a trough waveguide antenna mounted to the printed circuit board and having a base and a pair of sidewalls extending from the base, a fin extending from the base along a center region between the pair of sidewalls and an open side opposite the base, wherein the trough waveguide antenna has a bend region in which a depth of the trough waveguide antenna gets shallower on an exterior side of the fin and a depth of the trough waveguide antenna gets deeper on an interior side of the fin so that the depth of the trough waveguide antenna is deeper on the interior side of the fin in the bend region than a depth of the trough waveguide antenna on the exterior side of the fin in the bend region.

2. The radar control module according to claim 1, wherein the printed circuit board includes a monolithic microwave integrated circuit (MMIC) for providing radio frequency signals to the radio frequency port.

3. The radar control module according to claim 1, further comprising a transition path from the radio frequency port to an end of the trough waveguide antenna.

4. The radar control module according to claim 1, wherein the depth of the trough on the interior of the fin includes a transition region which gradually increases in depth at an end entering into the bend region.

5. The radar control module according to claim 1, wherein the depth of the trough on the interior of the fin includes a transition region which gradually decreases in depth at an end exiting the bend region.

6. The radar control module according to claim 1, wherein the bend region includes a radiused 90 degree bend.

7. The radar control module according to claim 1, wherein the depth of the trough waveguide antenna on the exterior of the fin has a constant depth along a length of the trough waveguide antenna.

8. A radar control module, comprising:

a printed circuit board including a radio frequency port;

a trough waveguide antenna mounted to the printed circuit board and having a base and a first sidewall and a second sidewall each extending from the base, a fin extending from the base along a center region between the first sidewall and the second sidewall and an open side opposite the base, a first channel is disposed between the first sidewall and the fin and a second channel is formed between the second sidewall and the fin, wherein the trough waveguide antenna includes a bend region in which the first channel is on an interior of the bend region and the second channel is on an exterior of the bend region and a depth of the first channel is deeper in the bend region than a depth of the second channel in the bend region, wherein the second channel includes a transition region exterior to the bend region which gradually decreases in depth at an end entering into the bend region and the second channel remaining a constant depth through the entire bend region.

9. The radar control module according to claim 8, wherein the printed circuit board includes a monolithic microwave integrated circuit (MMIC) for providing radio frequency signals to the radio frequency port.

10. The radar control module according to claim 8, further comprising a transition path from the radio frequency port to an end of the trough waveguide antenna.

11. The radar control module according to claim 8, wherein the depth of the first channel includes a transition region which gradually increases in depth at an end entering into the bend region.

12. The radar control module according to claim 8, wherein the depth of the first channel includes a transition region which gradually decreases in depth at an end exiting the bend region.

13. The radar control module according to claim 8, wherein the bend region includes a radiused 90 degree bend.

14. The radar control module according to claim 8, wherein the depth of the second channel has a constant depth along a length of the trough waveguide antenna.

* * * * *